US012571092B2

(12) United States Patent
Mebarki et al.

(10) Patent No.: US 12,571,092 B2
(45) Date of Patent: Mar. 10, 2026

(54) INTEGRATED METHODS FOR GRAPHENE FORMATION

(71) Applicant: Applied Materials, Inc., Santa Clara, CA (US)

(72) Inventors: Bencherki Mebarki, Santa Clara, CA (US); Thai Cheng Chua, Cupertino, CA (US); Christian W. Valencia, Alhambra, CA (US); Joung Joo Lee, San Jose, CA (US); Xianmin Tang, San Jose, CA (US); Xiao Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 299 days.

(21) Appl. No.: 17/844,181

(22) Filed: Jun. 20, 2022

(65) Prior Publication Data

US 2023/0017035 A1     Jan. 19, 2023

Related U.S. Application Data

(60) Provisional application No. 63/222,093, filed on Jul. 15, 2021.

(51) Int. Cl.
*C23C 16/52*          (2006.01)
*C23C 16/27*          (2006.01)
*C23C 16/511*         (2006.01)
*C23C 16/56*          (2006.01)

(52) U.S. Cl.
CPC .......... *C23C 16/274* (2013.01); *C23C 16/511* (2013.01); *C23C 16/52* (2013.01); *C23C 16/56* (2013.01)

(58) Field of Classification Search
CPC ..... C23C 16/274; C23C 16/511; C23C 16/52; C23C 16/56
See application file for complete search history.

(56) References Cited

U.S. PATENT DOCUMENTS

| | | | |
|---|---|---|---|
| 9,472,450 | B2 | 10/2016 | Bonilla et al. |
| 10,685,836 | B2 | 6/2020 | Tan et al. |
| 2013/0243969 | A1 | 9/2013 | Teng et al. |
| 2015/0280011 | A1 | 10/2015 | Cho et al. |
| 2019/0085457 | A1 | 3/2019 | Fuku et al. |

(Continued)

FOREIGN PATENT DOCUMENTS

| | | |
|---|---|---|
| CN | 112795983 A | 5/2021 |
| KR | 20070120986 A | 12/2007 |

(Continued)

OTHER PUBLICATIONS

PCT International Search Report and Written Opinion in PCT/US2022/034226 dated Oct. 13, 2022, 10 pages.

(Continued)

*Primary Examiner* — Hai Y Zhang
(74) *Attorney, Agent, or Firm* — SERVILLA WHITNEY LLC

(57)          ABSTRACT

A method of forming graphene layers is disclosed. The method includes precleaning the substrate with a plasma formed from an argon- and hydrogen-containing gas, followed by forming a graphene layer by exposing the substrate to a microwave plasma to form a graphene layer on the substrate. The microwave plasma comprises hydrocarbon and hydrogen radicals. The substrate is then cooled. A capping layer may also be formed.

17 Claims, 3 Drawing Sheets

(56) References Cited

U.S. PATENT DOCUMENTS

| | | | |
|---|---|---|---|
| 2019/0144283 A1 | 5/2019 | Jakobsen et al. | |
| 2019/0244805 A1* | 8/2019 | Tan | H01L 21/3065 |
| 2020/0105524 A1* | 4/2020 | Shin | C01B 32/186 |
| 2020/0105525 A1 | 4/2020 | Zhou et al. | |
| 2020/0381275 A1* | 12/2020 | Brezoczky | B65G 29/00 |

FOREIGN PATENT DOCUMENTS

| | | |
|---|---|---|
| KR | 20170091962 A | 8/2017 |
| WO | 2021067118 A1 | 4/2021 |

OTHER PUBLICATIONS

Adhikari, Sudip , et al., "Catalyst-Free Growth of Graphene by Microwave Surface Wave Plasma Chemical Vapor Deposition at Low Temperature", Journal of Materials Science and Chemical Engineering (2016), 4, pp. 10-14.

Chen, Xiangping , et al., "Synthetic Metals", Elsevier Journal, Synthetic Metals 210 (2015) 95-108, Jul. 21, 2015, 1-14.

Choi, Dong Soo, et al., "Effect of Cooling Condition on Chemical Vapor Deposition Synthesis of Graphene on Copper Catalyst", ACS Appl. Mater. Interfaces 2014, 6, 19574-19578.

Ferrah, Djawhar , et al., "CF4/H2 Plasma Cleaning of Graphene Regenerates Electronic Properties of the Pristine Material", ACS Applied Nano Materials, pp. 1-21.

Umeno, Masayoshi , et al., "Diamond-like carbon thing films by microwave surface-wave plasma CVD aimed for the application of photovoltaic solar cells", Diamond and Related Materials 14 (2005) 1973-1979.

Xiao, Ke , et al., "The study of the effects of cooling conditions on high quality graphene growth by the APCVD method", Nanoscale, 2013, 5, 5524.

* cited by examiner

200

210

208

206

204

202

INTEGRATED METHODS FOR GRAPHENE FORMATION

CROSS-REFERENCE TO RELATED APPLICATIONS

This application claims priority to U.S. Provisional Application No. 63/222,093, filed Jul. 15, 2021, the entire disclosure of which is hereby incorporated by reference herein.

TECHNICAL FIELD

Embodiments of the present disclosure generally relate to the field of semiconductor devices and semiconductor device manufacturing. More particularly, embodiments of the present disclosure provide methods for depositing or forming graphene.

BACKGROUND

As a result of its outstanding optical and electrical properties, graphene has been attracting tremendous amounts of attention in semiconductor manufacturing. Due to its unique 2D honeycomb-shaped lattice and one atomic layer structure, graphene, a monolayer of carbon atoms arranged in a hexagonal lattice, has extraordinary potential for the future of the electronics industry. Graphene is the thinnest material, with a thickness of one carbon atom, about 3.35 angstrom. Graphene, therefore, has the highest specific surface area (SSA) recorded among carbon materials. This high SSA provides the promising attribute that graphene is able to store more energy than other carbonaceous materials. Additionally, the delocalized electrons in graphene sheets are able to travel at high speeds with intrinsic mobility of about $2-2.5 \times 10^5$ cm$^2$/vs; thereby helping to transport current efficiently. Due to its thin thickness and high electron mobility, graphene can be used as a replacement for traditional metal barrier layers in semiconductor devices because the resistance of metal lines gets higher and higher as their thickness and dimensions continue to shrink. Graphene also demonstrates high optical transparency, which can be used in flexible electronics, for example in smart watch applications.

Traditional graphene CVD growth requires high temperature (>1000° C.) and metal foils as catalysts. At this high temperature, most materials used in the electronic applications could be damaged. Additionally, the metal foils need to be removed after graphene growth. The transfer process is costly and could damage graphene layers and cause metal contamination as well.

Currently, chemical vapor deposition (CVD) with metal catalysts is used to grow graphene films. Although high quality graphene films can be deposited by CVD growth, it requires high growth temperature, typically 800-1000° C. or more. This is not compatible with current integration flows in the semiconductor industry because the metal lines and low k films on device wafers cannot tolerate such high temperatures. In addition, prior to graphene growth, the substrate needs to be precleaned to reduce metal oxides and control nucleation sites. Preclean processes utilize hydrogen ($H_2$) plasma in a microwave chamber. Such precleaning, however, damages the other films (e.g., low-κ layer) on the substrate. Accordingly, there is a need for improved methods of depositing graphene layers without causing damage to the underlying layers on the substrate.

SUMMARY

One or more embodiments of the disclosure are directed to a method of forming a graphene layer. In some embodiments, the method comprises: exposing a substrate comprising one or more of a conductive material and a dielectric material to a first plasma to clean the conductive material, the first plasma formed from an argon-hydrogen containing gas; exposing the substrate to a second plasma to form a graphene layer on the substrate, the second plasma comprising argon, hydrocarbon, and hydrogen radicals; and cooling the substrate to a temperature less than or equal to 100° C. at a controlled rate.

Additional embodiments of the disclosure are directed to a processing tool. In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a pre-cleaning chamber, a graphene deposition chamber, and a cooling chamber; and a controller connected to the central transfer station and the plurality of process stations, the controller configured to activate the robot to move the wafer between process stations, and to control a process occurring in each of the process stations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
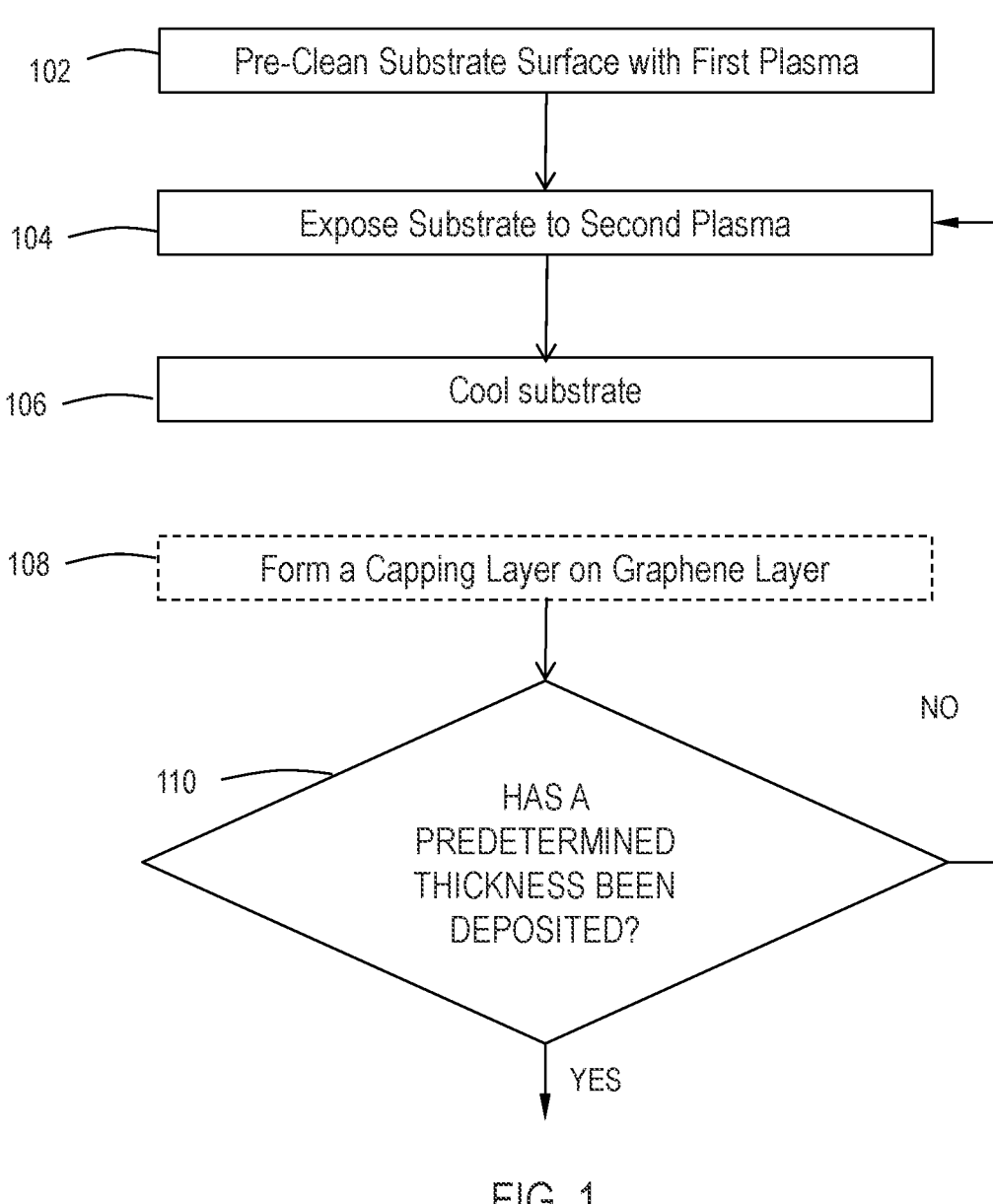
FIG. 1 is a process flow diagram of a method for forming a graphene layer according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

Embodiments of the present disclosure relate to methods for forming graphene layers. Typical cleaning methods for removing oxide contaminants (e.g., $H_2$ plasma) can damage the —OH terminations of the dielectric material. Some embodiments of the disclosure advantageously remove oxide contaminants without decreasing —OH terminations of the dielectric material. Some embodiments of the disclosure advantageously provide integrated methods for forming graphene layers while not damaging additional layers present on the substrate.

Figure 2:
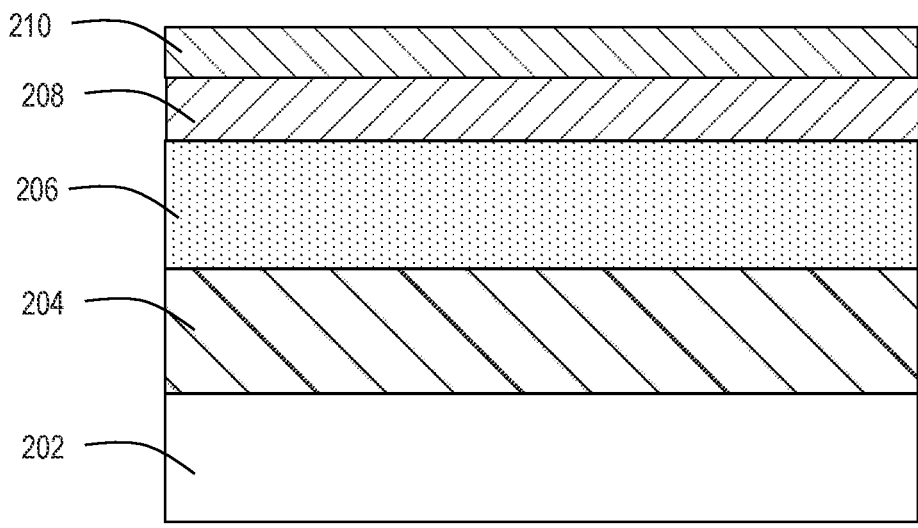
FIG. 2 is a cross-sectional view of a substrate according to one or more embodiments.

FIG. 1 illustrates a process flow diagram of a method 100. FIG. 2 is a cross-sectional view of a substrate according to one or more embodiments. Referring to FIGS. 1 and 2, a method 100 for forming a graphene layer 208 is shown. The method 100 begins at operation 102 by exposing a substrate surface 200 to an argon and hydrogen-containing plasma to clean the substrate surface. In other embodiments, the conductive layer 206 may be contaminated with one or more of metal oxides and residues. In one or more embodiments, the substrate comprises one or more of a conductive layer 206 and a dielectric layer 204. The conductive layer 206 may have oxide contaminants thereon. Thus, in one or more embodiments, the substrate is exposed to an argon and hydrogen-containing plasma to clean the surface of the conductive layer 206 and remove the oxide contaminants. Cleaning the conductive layer 206 with an argon and hydrogen-containing plasma may also control carbon nucleation sites.

In one or more embodiments, the conductive layer 206 comprises any suitable conductive material known to the skilled artisan. In some embodiments, the conductive material comprises one or more of copper (Cu), manganese (Mn), cobalt (Co), tungsten (W), ruthenium (Ru), or molybdenum (Mo). In one or more embodiments, the conductive material comprises or consists essentially of copper (Cu). As used in this specification and the appended claims, the term "consists essentially of" means that greater than or equal to about 95%, 98% or 99% of the specified material is the stated material.

In some embodiments, the conductive layer comprises a binary material. In one or more embodiments, the binary material comprises a first metal and a second metal. The first metal and the second metal may be any suitable metal known to the skilled artisan. In one or more embodiments, the binary material comprises one or more of copper ruthenium (CuRu), copper tungsten (CuW), copper molybdenum (CuMo), cobalt ruthenium (CoRu), cobalt tungsten (CoW), and cobalt molybdenum (CoMo).

Accordingly, in one or more embodiments, the conductive material is contaminated with oxides, and the conductive material oxide is selected from one or more of copper oxide (CuO), manganese oxide (MnO), cobalt oxide (CoO), tungsten oxide (WO), ruthenium oxide (RuO), or molybdenum oxide (MoO). In one or more embodiments, the conductive material oxide comprises or consists essentially of copper oxide (CuO).

In one or more embodiments, the dielectric material 204 may comprise any suitable dielectric material known to the skilled artisan. In some embodiments, the dielectric material 204 comprises one or more of silicon, silicon oxide, silicon nitride, silicon carbide, and low-κ dielectrics. As used herein, terms such as "silicon oxide" and "silicon nitride" refer to materials comprising silicon and oxygen or silicon and nitrogen. "Silicon oxide" and "silicon nitride" should not be understood to imply any stoichiometric ratio. Stated differently, a dielectric material comprising silicon oxide or silicon nitride may be stoichiometric or non-stoichiometric, silicon-rich or silicon-poor.

In some embodiments, the dielectric material comprises silicon oxide ($SiO_2$).

Referring to FIG. 1, operation 102, in one or more embodiments, the substrate is exposed to a plasma formed from an argon-containing gas and a hydrogen-containing gas to remove the oxide contaminants. In some embodiments, all or nearly all of the oxide contaminants are removed. In some embodiments, greater than 10%, greater than 25%, greater than 50% greater than 80% or greater than 90% of the oxide contaminants are removed.

In one or more embodiments, the argon-containing gas can be any suitable gas which removes oxide contaminants from the conductive material surface. In some embodiments, the argon-containing gas consists essentially of argon (Ar). In one or more embodiments, the hydrogen-containing gas may be any suitable gas capable of generating hydrogen radicals and which removes oxide contaminants from the conductive material surface. In some embodiments, the hydrogen-containing gas comprises or consists essentially of hydrogen gas ($H_2$). As used in this regard, a process gas which consists essentially of a stated gas comprises greater than or equal to 95%, greater than or equal to 98%, greater than or equal to 99%, greater than or equal to 99.5% of the stated gas on a molar basis, excluding any inert diluent or carrier gasses.

In one or more embodiments, the argon- and hydrogen-containing gas is ignited to form a plasma. The plasma may be generated by any suitable means, including, but not limited to, remote plasma and direct plasma. The plasma may be an inductively coupled plasma (ICP) or capacitively coupled plasma (CCP). In one or more embodiments, the plasma has a power in a range of 1400 W to 3000 W, in a range of 1300 W to 2800 W, in a range of 1400 W to 2600 W, or in a range of 1450 W to 1550 W. In one or more embodiments, the microwave plasma has a peak power of less than or equal to about 30 kW.

In one or more embodiments, the substrate may be exposed to the plasma for any period of time sufficient to remove the oxide contaminants from the conductive surface. In some embodiments, the substrate is cleaned by the plasma for a period in a range of 0.5 seconds to 30 seconds, in a range of 1 second to 10 seconds, or in a range of 2 seconds to 5 seconds.

In one or more embodiments, the substrate is exposed to the argon- and hydrogen-containing plasma to preclean the substrate in a first chamber that is separate from the chamber used for formation of the graphene layer at operation 104. In some embodiments, there is no vacuum break between the preclean and the formation of the graphene layer.

Referring to FIGS. 1 and 2, at operation 104, after the substrate 200 is cleaned by exposing the substrate to a plasma formed from an argon- and hydrogen-containing gas, a graphene layer 208 is formed on the substrate. In some embodiments, the graphene layer 208 formed on the top surface of the conductive layer 206 or on the top surface of the dielectric layer 204 may be considered a capping layer. In one or more embodiments, the substrate is exposed to a microwave plasma comprising hydrocarbon, argon, and hydrogen radicals to form a graphene layer on the substrate.

In one or more embodiments, the microwave plasma has a peak power of less than or equal to 3000 W, less than or equal to 2900 kW, or in the range of from about 1425 W to 2850 W. In some embodiments, the microwave plasma has a frequency in the range of about 1 GHz to about 5 GHz, or in the range of about 2.4 GHz to about 2.5 GHz.

Without intending to be bound by theory, it is believed that the microwave plasma advantageously provides a plasma which has a high radical density but a low energy. It is believed that the higher radical density favors high chemical reactivity and that the low energy minimizes ion bombardment of the substrate and the associated damage and defects.

In one or more embodiments, the microwave plasma has a radical density (radicals/cm$^3$) of greater than or equal to about $10^{12}$, greater than or equal to about $10^{13}$, greater than or equal to about $10^{14}$, greater than or equal to about $10^{15}$, greater than or equal to about $10^{16}$, or greater than or equal to about $10^{17}$ radicals/cm$^3$. In some embodiments, the microwave plasma has an energy of less than or equal to about 25 eV, less than or equal to about 20 eV, less than or equal to about 15 eV, less than or equal to about 10 eV, less than or equal to about 8 eV, less than or equal to about 6 eV, less than or equal to about 5 eV, less than or equal to about 4 eV, less than or equal to about 2 eV, or less than or equal to about 1 eV. In some embodiments, the microwave plasma has a plasma energy in the range of about 0.1 eV to about 50 eV, or in the range of about 0.5 eV to about 25 eV, or in the range of about 1 eV to about 10 eV.

In one or more embodiments, the microwave plasma comprises hydrocarbon and hydrogen radicals. In some embodiments, a hydrocarbon gas and a hydrogen-containing gas are ignited to form the plasma comprising hydrocarbon and hydrogen radicals. In some embodiments, the plasma is ignited in a region adjacent to the substrate surface within a processing chamber.

In one or more embodiments, the hydrocarbon gas can be any suitable gas comprising carbon atoms and hydrogen atoms. In some embodiments, the hydrocarbon gas consists essentially of carbon atoms and hydrogen atoms. In some embodiments, the hydrocarbon gas has less than or equal to 6 carbon atoms. In some embodiments, the hydrocarbon gas comprises one or more of methane, ethane, propane, butane, ethylene, propene, or acetylene. Without intending to be bound by theory, it is believed that the hydrocarbon radicals primarily react on the substrate surface to form the graphene layers.

In one or more embodiments, the hydrogen-containing gas may be any suitable gas capable of generating hydrogen radicals. In some embodiments, the hydrogen-containing gas comprises or consists essentially of hydrogen gas ($H_2$). Without intending to be bound by theory, it is believed that the hydrogen radicals etch any amorphous carbon generated by the hydrocarbon radicals from the substrate surface. In some embodiments, the graphene layers comprise substantially no amorphous carbon.

In some embodiments, the hydrocarbon gas and the hydrogen-containing gas are delivered to the processing chamber sequentially. In some embodiments, hydrocarbon gas and the hydrogen-containing gas are delivered to the processing chamber simultaneously. In some embodiments, the hydrocarbon gas and the hydrogen-containing gas are mixed prior to entering the processing chamber. In some embodiments, the hydrocarbon gas and the hydrogen-containing gas are delivered with an inert carrier gas. In some embodiments, the carrier gas comprises argon.

In one or more embodiments, the substrate is exposed to the hydrocarbon gas and the hydrogen-containing gas at operation 104 in a processing chamber that is separate from the chamber used for pre-cleaning the substrate at operation 102. In some embodiments, there is no vacuum break between the preclean and the formation of the graphene layer.

In one or more embodiments, the temperature of the substrate surface may be controlled during formation of the graphene layer 208. In some embodiments, the substrate surface is maintained at a temperature of less than or equal to about 800° C., less than or equal to about 750° C., less than or equal to about 700° C., less than or equal to about 650° C., less than or equal to about 600° C., less than or equal to about 500° C., less than or equal to about 400° C., less than or equal to about 300° C., less than or equal to about 200° C., less than or equal to about 100° C., less than or equal to about 50° C., or less than or equal to about 25° C. In some embodiments, the substrate surface is maintained at a temperature in a range of about room temperature (e.g., 25° C.) to about 800° C., about 25° C. to about 500° C., or about 25° C. to about 300° C., or about 25° C. to about 150° C.

Without intending to be bound by theory, it is believed that CVD processes for forming graphene layers are typically performed at temperatures in excess of 1000° C. The present disclosure provides methods for depositing graphene layers at a lower temperature. It is believed that these lower temperatures are more compatible with the thermal budget of electronic devices during manufacture.

Referring to FIG. 1, after the substrate is exposed to the hydrocarbon and hydrogen-containing plasma to form the graphene layer (operation 104), at operation 106, the substrate is cooled at a controlled rate. In some embodiments, the substrate is cooled to a temperature less than or equal to 200° C., or less than or equal to 150° C., or less than or equal to 100° C., or less than or equal to 50° C. In one or more embodiments, the substrate is cooled at a rate in a range of from 0.1° C./s to 50° C./s, including a rate in a range of from 0.3° C./s to 20° C./s.

In one or more embodiments, the substrate is cooled in a cooling chamber. In some embodiments, there is no vacuum break between the plasma exposure and the cooling.

With reference to FIGS. 1 and 2, in one or more embodiments, at operation 108, an optional capping layer 210 may be formed on a top surface of the graphene layer 208. The capping layer 210 may comprise any suitable material known to the skilled artisan. In one or more embodiments, the capping layer 210 comprises one or more of copper (Cu), manganese (Mn), cobalt (Co), tungsten (W), ruthenium (Ru), and molybdenum (Mo). In some embodiments, the capping layer 210 may comprise a binary material selected from one or more of copper ruthenium (CuRu), copper tungsten (CuW), copper molybdenum (CuMo), cobalt ruthenium (CoRu), cobalt tungsten (CoW), and cobalt molybdenum (CoMo).

The formation process at operation 104 and the cooling process at operation 106 may be performed until a predetermined thickness of graphene has been formed. At operation 110, the thickness of the formed graphene layer is evaluated to determine if it has reached the predetermined thickness. If the predetermined graphene layer thickness has not been reached, the method 100 returns to operation 104 for further formation. If the predetermined graphene layer thickness has been reached, the method 100 ends.

In some embodiments, operation 110 may be able to be conducted while operation 104 and/or operation 106 is still being performed. Alternatively, in some embodiments, operation 104 and/or operation 106 may be ceased before and/or during operation 110.

In some embodiments, the graphene layer 208 formed by the disclosed method comprises less than or equal to about 1, less than or equal to about 2, less than or equal to about 5, less than or equal to about 10, less than or equal to about 15, or less than or equal to about 20, or less than or equal to about 30 monolayers of graphene. In some embodiments, the graphene layer formed by the disclosed method comprises in the range of about 0.5 to about 25 monolayers, or in the range of about 0.5 to about 10 monolayers, or in the range of about 2 to about 15 monolayers, or in the range of about 5 to about 10 monolayers of graphene. In some embodiments, the graphene layer 208 formed by the disclosed method has a thickness of less than or equal to about 3 Å, less than or equal to about 5 Å, less than or equal to about 10 Å, less than or equal to about 15 Å, less than or equal to about 20 Å, less than or equal to about 25 Å, less than or equal to about 30 Å, less than or equal to about 40 Å, or less than or equal to about 50 Å.

In some embodiments, the method 100 is capable of being performed in a relatively short time period. In some embodiments, the graphene layer 208 is formed in a period of less than or equal to about 15 minutes, less than or equal to about 10 minutes, less than or equal to about 5 minutes, less than or equal to about 2 minutes, or less than or equal to about 1 minute.

In some embodiments, the resistance of the graphene layer 208 formed by the disclosed method is relatively low. In some embodiments, the graphene layer 208 has a resistance of less than or equal to about 2000 ohm/square, less than or equal to about 1000 ohm/square, less than or equal to about 500 ohm/square, less than or equal to about 400 ohm/square, less than or equal to about 300 ohm/square, less than or equal to about 250 ohm/square, or less than or equal to about 200 ohm/square.

Figure 3:
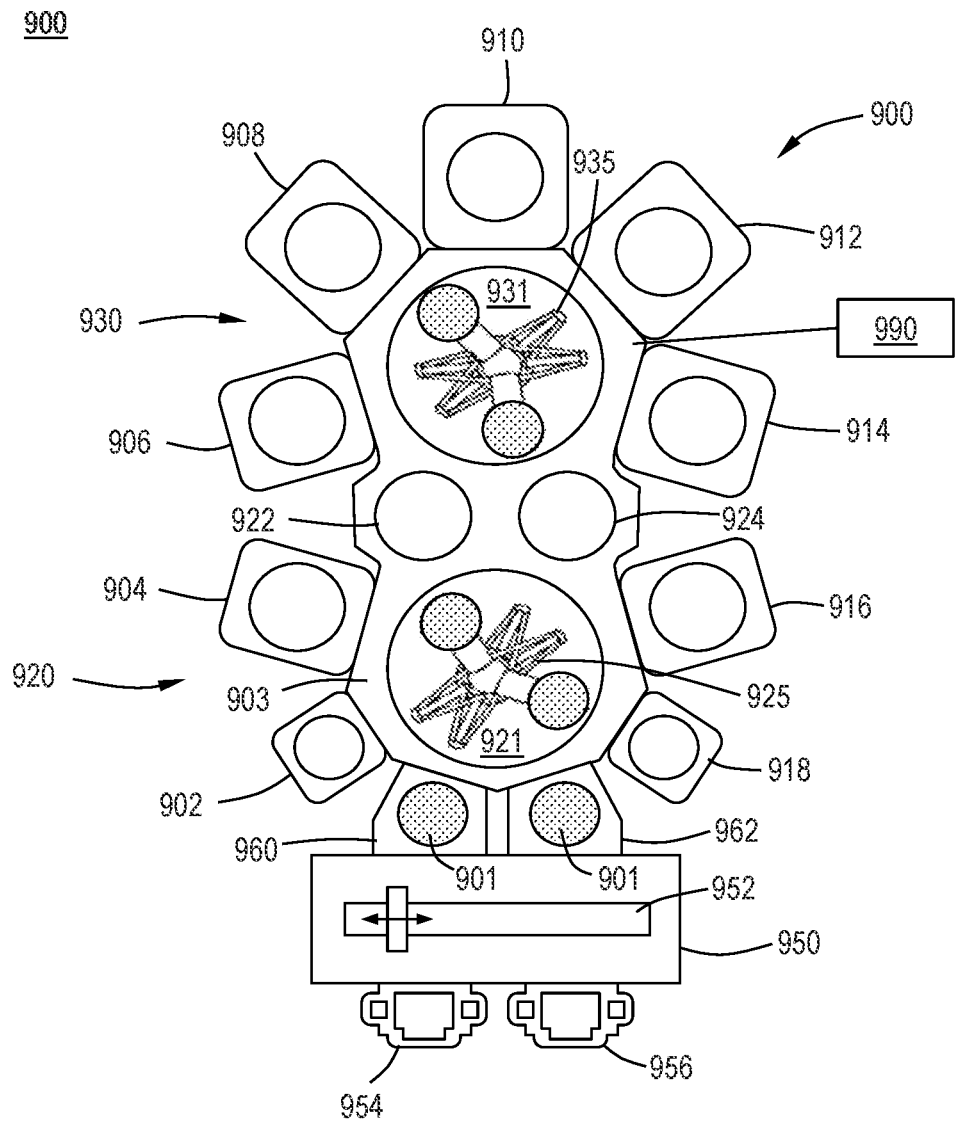
FIG. 3 is a cluster tool accordance with one or more embodiments of the disclosure.

With reference to FIG. 3, additional embodiments of the disclosure are directed to processing tools 900 that can be used with the processing chamber of one or more embodiments to perform the methods described.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cooling chamber, a graphene deposition chamber, a capping chamber, an annealing chamber, an etching chamber, a thermal processing (RTP) chamber, a plasma oxidation chamber, a plasma nitridation chamber, and an atomic layer deposition (ALD) chamber, and the like. The particular arrangement of process chambers and components can be varied depending on the cluster tool and should not be taken as limiting the scope of the disclosure.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

The controller 990 of some embodiments has one or more configurations selected from: a configuration to move a substrate on the robot between the plurality of processing chambers and metrology station; a configuration to load and/or unload substrates from the system; a configuration to preclean the substrate; a configuration to deposit a graphene layer on the substrate; a configuration to deposit a capping layer; and/or a configuration to cool the substrate.

In one or more embodiments, a first processing chamber 908 can be configured for microwave plasma to form a graphene layer on the substrate. The substrate can be moved to and from the processing chamber 908 by the robot 931 passing through pass through 922.

Processing chamber 902 can also be connected to the transfer station 931. In some embodiments, processing chamber 902 comprises an argon- and hydrogen-containing plasma cleaning chamber for cleaning the substrate and is in fluid communication with one or more reactive gas sources to provide flows of reactive gas to the processing chamber 902. In some embodiments, processing chamber 908 comprises a plasma reaction chamber for forming a graphene material. In some embodiments, processing chamber 912 comprises a deposition chamber for depositing a capping layer and is in fluid communication with one or more reactive gas sources to provide flows of reactive gas to the processing chamber 912. In some embodiments, processing chamber 916 comprises a cooling chamber.

The skilled artisan will recognize that the number and arrangement of individual processing chambers on the tool can be varied, and that the embodiment illustrated in FIG. 3 is merely representative of one possible configuration.

In some embodiments, the processing system 900 includes one or more metrology stations. For example, metrology stations can be located within the transfer stations 931, 921 or within any of the individual processing chambers. The metrology station can be any position within the system 900 that allows the distance of the recess to be measured without exposing the substrate to an oxidizing environment.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a graphene layer, the method comprising:

exposing a substrate comprising one or more of a conductive material and a dielectric material to a first plasma to clean the conductive material and remove oxide contaminants, the first plasma formed from an argon-hydrogen gas;

exposing the substrate to a second plasma to form the graphene layer on the substrate, wherein the second plasma is a microwave plasma comprising argon, hydrocarbon, and hydrogen radicals, and wherein there is no vacuum break between exposure to the first plasma and exposure to the second plasma; and cooling the substrate to a temperature less than or equal to 100° C. at a controlled rate in a cooling chamber, wherein there is no vacuum break between exposure to the second plasma and cooling the substrate.

2. The method of claim 1, wherein the conductive material comprises one or more of copper (Cu), manganese (Mn), cobalt (Co), tungsten (W), ruthenium (Ru), molybdenum (Mo), copper ruthenium (CuRu), copper tungsten (CuW), copper molybdenum (CuMo), cobalt ruthenium (CoRu), cobalt tungsten (CoW), and cobalt molybdenum (CoMo).

3. The method of claim 1, wherein the conductive material comprises copper oxide (CuO), manganese oxide (MnO), cobalt oxide (CoO), tungsten oxide (WO), ruthenium oxide (RuO), or molybdenum oxide (MoO).

4. The method of claim 1, wherein the dielectric material comprises one or more of silicon, silicon oxide, silicon nitride, silicon carbide, and low-K dielectrics.

5. The method of claim 1, wherein the first plasma has a power in a range of 1400 W to 3000 W.

6. The method of claim 1, wherein the microwave plasma has a peak power of less than or equal to about 30 KW.

7. The method of claim 1, wherein the microwave plasma has a radical density of greater than or equal to about 1012 radicals/cm$^3$.

8. The method of claim 1, wherein the microwave plasma has an energy of less than or equal to about 10 eV.

9. The method of claim 1, wherein a hydrocarbon gas and a hydrogen-containing gas are ignited to form the second plasma.

10. The method of claim 9, wherein the hydrocarbon gas comprises one or more of methane, ethane, propane, butane, ethylene, propene, or acetylene.

11. The method of claim 1, wherein a surface of the substrate is maintained at a temperature of less than or equal to about 500° C. during exposure to the first plasma and during exposure to the second plasma.

12. The method of claim 1, wherein the graphene layer comprises about 2 to about 15 monolayers of graphene.

13. The method of claim 12, wherein the graphene layer is formed in a period of less than or equal to about 60 minutes.

14. The method of claim 1, wherein the graphene layer has a resistance of less than or equal to about 500 ohm/ square.

15. The method of claim 1, further comprising forming a capping layer on the conductive material prior to forming the graphene layer.

16. The method of claim 15, wherein the capping layer comprises one or more of copper (Cu), manganese (Mn), cobalt (Co), tungsten (W), ruthenium (Ru), molybdenum (Mo), copper ruthenium (CuRu), copper tungsten (CuW), copper molybdenum (CuMo), cobalt ruthenium (CoRu), cobalt tungsten (CoW), and cobalt molybdenum (CoMo).

17. The method of claim 1, further comprising forming a capping layer on the graphene layer.

* * * * *